(12) United States Patent
De Los Toyos López et al.

(10) Patent No.: US 12,392,496 B2
(45) Date of Patent: Aug. 19, 2025

(54) COOKING APPLIANCE WITH RESIDUAL HEAT INDICATOR ASSEMBLY

(71) Applicant: EIKA, S.COOP., Etxebarria (ES)

(72) Inventors: Daniel De Los Toyos López, Eibar (ES); Agustín Etxebarrieta Alonso, Forua (ES)

(73) Assignee: EIKA, S.COOP., Etxebarria (ES)

( * ) Notice: Subject to any disclaimer, the term of this patent is extended or adjusted under 35 U.S.C. 154(b) by 870 days.

(21) Appl. No.: 17/591,926

(22) Filed: Feb. 3, 2022

(65) Prior Publication Data
US 2022/0243922 A1  Aug. 4, 2022

(30) Foreign Application Priority Data
Feb. 4, 2021  (ES) .............................. ES202130215U

(51) Int. Cl.
| | |
|---|---|
| F24C 7/08 | (2006.01) |
| G01R 15/20 | (2006.01) |
| G08B 7/06 | (2006.01) |
| G08B 21/02 | (2006.01) |

(52) U.S. Cl.
CPC .............. *F24C 7/083* (2013.01); *F24C 7/087* (2013.01); *G08B 7/06* (2013.01); *G08B 21/02* (2013.01); *G01R 15/202* (2013.01)

(58) Field of Classification Search
CPC . F24C 7/083; F24C 7/087; G08B 7/06; G08B 21/02; G01R 15/202
See application file for complete search history.

(56) References Cited

U.S. PATENT DOCUMENTS

| | | | | |
|---|---|---|---|---|
| 3,186,472 A | * | 6/1965 | Caravella ................. | H05B 3/76 340/517 |
| 5,648,722 A | * | 7/1997 | Merry ................ | G01R 31/3275 324/417 |
| 2002/0189464 A1 | * | 12/2002 | Schneider ............. | H05B 3/746 99/342 |
| 2013/0061488 A1 | * | 3/2013 | Lorenzi ................... | D06F 33/47 134/58 R |

FOREIGN PATENT DOCUMENTS

CA   2755100 A1 * 4/2012   ............ F23N 5/242

* cited by examiner

*Primary Examiner* — John P. Dulka
(74) *Attorney, Agent, or Firm* — Edell, Shapiro & Finnan, LLC

(57) ABSTRACT

A cooking appliance including a cooktop with a heating element, an electromechanical regulating device through which a user determines the power supplied to the heating element, and a residual heat indication assembly configured to warn the user of the presence of a high temperature in the cooktop. The residual heat indication assembly includes an indicator, a counter and an electronics board. The electromechanical regulating device, the indicator and counter being arranged connected directly to the electronics board, such that the electronics board detects an electrical signal flowing from the electromechanical regulating device to the heating element. The counter is configured to determine a duration of time in which the electronics board detects when power is being delivered from the electromechanical regulating device to the heating element. Upon power from the electromechanical regulating device to the heating element ceasing, the electronics board is configured to electrically power the indicator for a given amount of time based on the determined duration of time.

16 Claims, 1 Drawing Sheet

COOKING APPLIANCE WITH RESIDUAL HEAT INDICATOR ASSEMBLY

CROSS-REFERENCE TO RELATED APPLICATIONS

This application relates to and claims the benefit and priority to Spanish Utility Model No. U202130215, filed Feb. 4, 2021.

FIELD

The present invention relates to cooking appliances, in particular home cooking appliances, comprising a residual heat indicator assembly to warn the user against touching the cooktop when it is still hot.

BACKGROUND

Electrical or gas cooking appliances having indicator means indicating the presence of excess heat in the cooktop once the radiant source or the corresponding burner has been switched off are known.

U.S. Pat. No. 3,186,472 discloses a cooking appliance comprising heating elements and indicator means suitable for indicating the presence of a high temperature in the corresponding heating element once said heating element is no longer energized. The cooking appliance further comprises temperature-dependent control means and an electrical circuit comprising the indicator and the control means suitable for an independent power supply. The circuit is operable regardless of whether or not the heating element is energized, with the control means operating only to energize and de-energize the indication means.

U.S. Publication No. 2002/0189464 A1 discloses a cooking appliance with a safe residual heat warning device which also takes into account possible voltage interruptions. The cooking appliance comprises a conventional control through which the user selects the desired power, and the control can include microprocessors, a warning device, and a counter connected to the control and to the indicator. The cooking appliance further comprises a line voltage detector which measures the line voltage in the cooktop. The detection of an increase in voltage from zero to the operating voltage may occur during the first installation of the cooking appliance and when current is restored after there was a power outage, so when the increase in voltage is detected, a light warning signal is emitted.

SUMMARY

According to one implementation a cooking appliance is provided that comprises a cooktop, at least one heating element configured for heating a cooking utensil arranged on the cooktop, at least one electromechanical regulating device through which the user determines the power supplied to the heating element, each electromechanical regulating device being connected to the respective heating element, and residual heat indication means configured for warning the user of the presence of a high temperature in the cooktop, the residual heat indication means comprising at least one indicator and at least one counter.

The residual heat indication means comprise an electronics board, each electromechanical regulating device, each indicator, and each counter being arranged connected directly to the electronics board, such that the electronics board picks up the electrical signal flowing from each electromechanical regulating device to the corresponding heating element, detecting when the electromechanical regulating device stops powering the heating element, the counter being configured for counting the time during which the electronics board picks up said signal, and the electronics board being configured for electrically powering the indicator for a given time based on the value of the counter once the electromechanical regulating device stops powering the heating element.

The residual heat indication means can thereby be connected to a cooking appliance without having any effect on the control of the cooking appliance, furthermore, minimizing the wiring needed, on the other hand, in the residual heat indication means known in the state of the art.

These and other advantages and features will become apparent in view of the figures and the detailed description.

DETAILED DESCRIPTION

Figure 1:
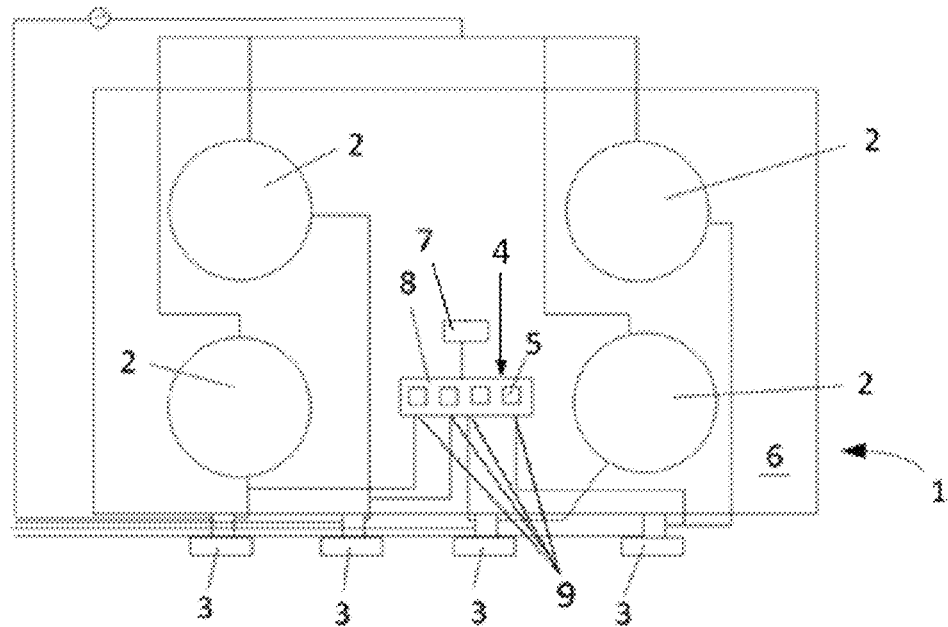
FIG. 1 shows a schematic view a cooking appliance according to a first embodiment.
Figure 2:
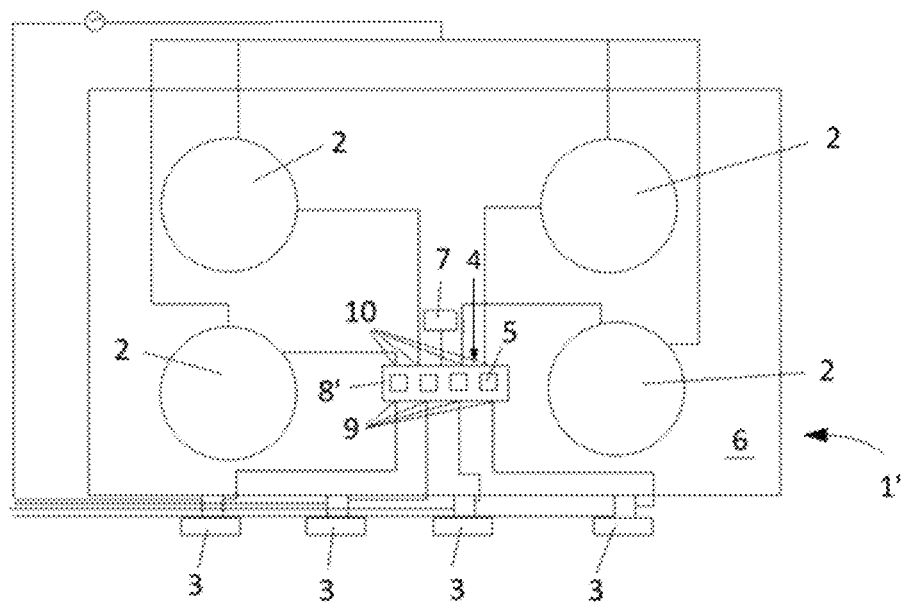
FIG. 2 shows a schematic view of a cooking appliance according a second embodiment.

FIGS. 1 and 2 schematically show a cooking appliance 1 and 1' according to the invention, comprising a cooktop 6, heating elements 2, in particular radiant sources, arranged under the cooktop 6, an electromechanical regulating device 3 connected to each radiant source 2 and configured for regulating the power supplied to the radiant source 2, and residual heat indicator assembly 4 configured to warn the user of the presence of a high temperature in the cooktop 6.

Electromechanical regulating devices 3 are known in the state of the art and a detailed description thereof is not considered necessary to comprehend the invention.

Moreover, the residual heat indication means 4 comprise an electronics board 8 and 8' connected to the electromechanical regulating devices 3 such that it picks up the electrical signal flowing from each electromechanical regulating device 3 to the corresponding heating element 2, detecting when the electromechanical regulating device 3 stops powering the heating element 2.

The residual heat indication assembly 4 further comprises at least one counter 7 configured for counting the time during which the electronics board 8 and 8' picks up the electrical signal from the electromechanical regulating device 3 that results in the heating element 2 being switched on, and at least one indicator 5, the electronics board 8 and 8' being configured for actuating the indicator 5 for a given time once it is detected that the heating element 2 has been switched off, said time being the residual heat indication time during which the user should not touch the hob to avoid burns.

The residual heat indicator assembly 4 can include an indicator 5 associated with each radiant source 2 or a single indicator 5 in the cooktop 6 which indicates that a temperature of at least one radiant source is unsafe to be touched. The indicator 5 can be a visual indicator and/or it can emit a sound. Preferably, the indicator 5 is a light indicator comprising at least one LED. The indicator 5 can adopt different configurations or geometric shapes. Therefore, in one example, the indicator can surround the perimeter of the radiant source. In another example, the indicator can be a segment display showing the time remaining until it shuts off. In another example, the indicator is configured for showing the user different burn risk levels through the intensity or the flashing of the LED. The indicator can furthermore indicate whether the cooktop is more or less hot.

Moreover, the electronics board 8 and 8' is connected directly to each electromechanical regulating device 3, to each indicator 5, and to each counter 7, being independent from the rest of the electrical circuit of the cooking appliance 1.

In the first embodiment shown in FIG. 1, the electronics board 8 is connected with the electromechanical regulating devices 3 but not with the heating elements 2. The electronics board 8 comprises input connectors 9 through which it is connected to an output of the electromechanical regulating device 3. The electronics board 8 thereby detects the presence or absence of voltage at the output of the electromechanical regulating device 3, detecting the zero-crossings of the AC voltage signal.

The counter 7 is configured for counting the time that the heating element 2 has been switched on, such that the residual indication time during which the indicator 5 is activated is established based on said time.

The input connectors 9 are arranged on one of the sides of the electronics board 8, the indicator means 5 being arranged on the other side of the electronics board 8, such that the side including the indicator means can be arranged in direct contact with the cooktop 6.

The residual heat indication assembly 4 can include a single counter 7 or several counters 7, one for each heating element 2, said counter or counters 7 preferably being arranged in the electronics board 8.

In the second embodiment shown in FIG. 2, the electronics board 8' is furthermore connected to the corresponding heating element 2, such that the current flowing from the electromechanical regulating device 3 to the heating element 2 goes through the electronics board 8'. To that end, the electronics board 8 comprises one input 9 for each electromechanical regulating device 3 through which the electronics board is connected with the electromechanical regulating device 3, and one output connector 10 for each heating element 2 through which the electronics board 8' is connected to the corresponding heating element 2.

In the second embodiment, the electronics board 8' comprises one Hall effect sensor (not depicted in the figures) for each heating element 2, the Hall effect sensor being connected to the input connector 9 and to the output connector 10. When the user positions the electromechanical regulating device 3 in the ON position, the current supplied to said heating element 2 through the electromechanical regulating device 3 passes through the corresponding Hall effect sensor, with the electronics board 8' detecting a voltage signal proportional to the power of the corresponding heating element 2. When the user disconnects the power supply from the corresponding heating element 2 by positioning the electromechanical regulating device 3 in the OFF position, current no longer passes through the Hall effect sensor, so it does not generate a difference in potential, a signal not being detected in the electronics board 8'. The counter 7 is configured for counting the time that the heating element 2 has been switched on and the time that the heating element 2 has been switched off for safety reasons while the electromechanical regulating device 3 is in the ON position such that the residual indication time during which the indicator 5 is activated is established based on both times and the power of the radiant element 2. The electronics board 8' is capable of determining the power level at which the heating element 2 operates through the current flowing to the heating element 2 and going through said electronics board 8.

The Hall effect sensors and the input connector 9 and output connector 10 are arranged on one of the sides of the electronics board 8', the indicator means 5 being arranged on the other side of the electronics board 8, such that the side including the indicator means can be arranged in direct contact with the cooktop 6.

The residual heat indication assembly 4 can include a single counter 7 or several counters 7, one for each heating element 2, said counter or counters 7 preferably being arranged in the electronics board 8'.

Lastly, in both embodiments, the electronics board 8 and 8' can be independently powered by a power source other than the power source of the cooking appliance, or it can be powered by the power source of the cooking appliance.

What is claimed is:

1. A cooking appliance comprising:
   a cooktop;
   a first heating element configured to heat a cooking utensil arranged on or in the cooktop;
   a first electromechanical regulating device through which the user determines an electrical current to be supplied to the first heating element, the first electromechanical regulating device having an ON position in which the electrical current is delivered to the first heating element, and an OFF position in which the electrical current is not delivered to the first heating element; and
   a residual heat indication assembly configured to warn the user that a temperature of the first heating element renders at least a first portion of the cooktop unsafe to be touched, the residual heat indication assembly including a first indicator, a first counter and an electronics board;
   the first electromechanical regulating device, first indicator and first counter being arranged connected directly to the electronics board, the electronics board being configured to detect when the electrical current is being delivered from the first electromechanical regulating device to the first heating element and to detect when the electrical current from the first electromechanical regulating device to the first heating element ceases, the first counter being configured for determining a first duration of time in which the electronics board detects when the electrical current is being delivered from the first electromechanical regulating device to the first heating element, upon the electrical current from the first electromechanical regulating device to the first heating element ceasing, the electronics board is configured to electrically power the first indicator for a given amount of time based on the determined first duration of time.

2. The cooking appliance according to claim 1, wherein the first indicator and the first counter are each arranged in the electronics board.

3. The cooking appliance according to claim 1, wherein the electronics board comprises a Hall effect sensor, an input connector connected with the Hall effect sensor and through which the electronics board is electrically connected to the first electromechanical regulating device, and an output connector connected with the Hall effect sensor and through which the electronics board is connected to the first heating element, such that when the electrical current is delivered to the first heating element, the electrical current passes through Hall effect sensor and the Hall effect sensor produces an output voltage signal proportional to the electrical current delivered to the first heating element.

4. The cooking appliance according to claim 3, wherein the electronics board determines the electrical current is being delivered from the first electromechanical regulating device to the first heating element when the Hall effect sensor produces the output voltage signal.

5. The cooking appliance according to claim 3, wherein the input connector and the output connector are arranged on a first side of the electronics board and the first indicator is located on a second side of the electronics board, the first and second sides facing in opposite directions.

6. The cooking appliance according to claim 1, wherein the first electromechanical regulating device is configured to produce a voltage signal when in the ON position, the electronics board being electrically connected to the first electromechanical regulating device by an input connector, the electronics board being configured to detect a zero-crossing of the voltage signal proportional to a power level established in the corresponding electromechanical regulating device.

7. The cooking appliance according to claim 2, wherein the first electromechanical regulating device is configured to produce a voltage signal when in the ON position, the electronics board being electrically connected to the first electromechanical regulating device by an input connector, the electronics board being configured to detect a zero-crossing of the voltage signal proportional to a power level established in the corresponding electromechanical regulating device.

8. The cooking appliance according to claim 1, further comprising a second heating element, a second electromechanical regulating device associated with the second heating element, and a second indicator associated with the second heating element and arranged on the electronics board.

9. The cooking appliance according to claim 1, wherein the first indicator is a light indicator that illuminates.

10. The cooking appliance according to claim 1, wherein the first indicator is a segment display configured to show a time until the at least first portion of the stovetop is safe to touch.

11. The cooking appliance according to claim 9, wherein the first indicator is configured to indicate to the user different burn risk levels by varying an intensity of light emitted by the first indicator.

12. The cooking appliance according to claim 10, wherein the first indicator is configured to indicate to the user different burn risk levels by a flashing of light emitted by the first indicator.

13. The cooking appliance according to claim 1, wherein the first indicator is an audible indicator.

14. The cooking appliance according to claim 1, wherein the given amount of time increases with an increase in the determined first duration of time.

15. The cooking appliance according to claim 1, wherein the electronics board is not electrically connected to the first heating element.

16. The cooking appliance according to claim 2, wherein the electronics board is not electrically connected to the first heating element.

* * * * *